United States Patent
Visser et al.

(10) Patent No.: US 8,294,514 B2
(45) Date of Patent: Oct. 23, 2012

(54) CALIBRATE OUTPUT MATCHING FOR CORRECT OUTPUT POWER

(75) Inventors: Hendrik Visser, Wijchen (NL); Roeland Heijna, Leuvensbroek (NL); Norbert Van Den Bos, Wijchen (NL)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 12/982,420

(22) Filed: Dec. 30, 2010

(65) Prior Publication Data

US 2012/0075016 A1    Mar. 29, 2012

Related U.S. Application Data

(60) Provisional application No. 61/386,055, filed on Sep. 24, 2010, provisional application No. 61/386,133, filed on Sep. 24, 2010.

(51) Int. Cl.
*H03F 3/191* (2006.01)
(52) U.S. Cl. ............................... 330/2; 330/305
(58) Field of Classification Search .............. 330/2, 302, 330/305; 333/25, 26
See application file for complete search history.

(56) References Cited

U.S. PATENT DOCUMENTS

| | | | |
|---|---|---|---|
| 5,986,617 A | 11/1999 | McLellan | |
| 6,868,260 B2 | 3/2005 | Jagielski et al. | |
| 6,946,847 B2 | 9/2005 | Nishimori et al. | |
| 7,535,312 B2 | 5/2009 | McKinzie, III | |
| 7,911,277 B2 * | 3/2011 | Paul et al. ..................... | 330/305 |
| 2005/0208917 A1 | 9/2005 | Roufoogaran et al. | |
| 2007/0035356 A1 | 2/2007 | Ranta | |
| 2008/0211598 A1 | 9/2008 | Eplett | |
| 2008/0278258 A1 * | 11/2008 | Liu .................................. | 333/25 |
| 2009/0096533 A1 | 4/2009 | Paul et al. | |

FOREIGN PATENT DOCUMENTS

| | | |
|---|---|---|
| EP | 1815604 B1 | 11/2008 |
| WO | 2004098076 A1 | 11/2004 |

OTHER PUBLICATIONS

Firraro, E.L. et al. "An Automatic Antenna Tuning System Using Only RF Signal Amplitudes", IEEE Transactions on Circuits and Systems II: Express Briefs, vol. 55, No. 9, pp. 833-837, Sep. 2008, ISSN: 1549-7747.

* cited by examiner

*Primary Examiner* — Steven J Mottola
(74) *Attorney, Agent, or Firm* — Coats & Bennett, P.L.L.C.

(57) ABSTRACT

A calibration unit calibrates a power amplifier load impedance to achieve a nominal amplifier load impedance after the connection of one or more external elements, e.g., antenna, to improve the accuracy and effectiveness of output power calibration. The calibration unit comprises an adaptive impedance unit and a controller. The adaptive impedance unit includes first and second variable impedance elements connected between the amplifier and the external load, e.g., antenna. The controller independently calibrates the imaginary and real parts of the load impedance by respectively selecting first and second calibration values for the first and second variable impedance elements based on a reference voltage. More particularly, the controller selects calibration values for the first and second variable impedance elements from a plurality of impedance values based on a comparison between a reference voltage and the calibrated voltages produced at the output of the power amplifier responsive to the impedance values.

23 Claims, 7 Drawing Sheets

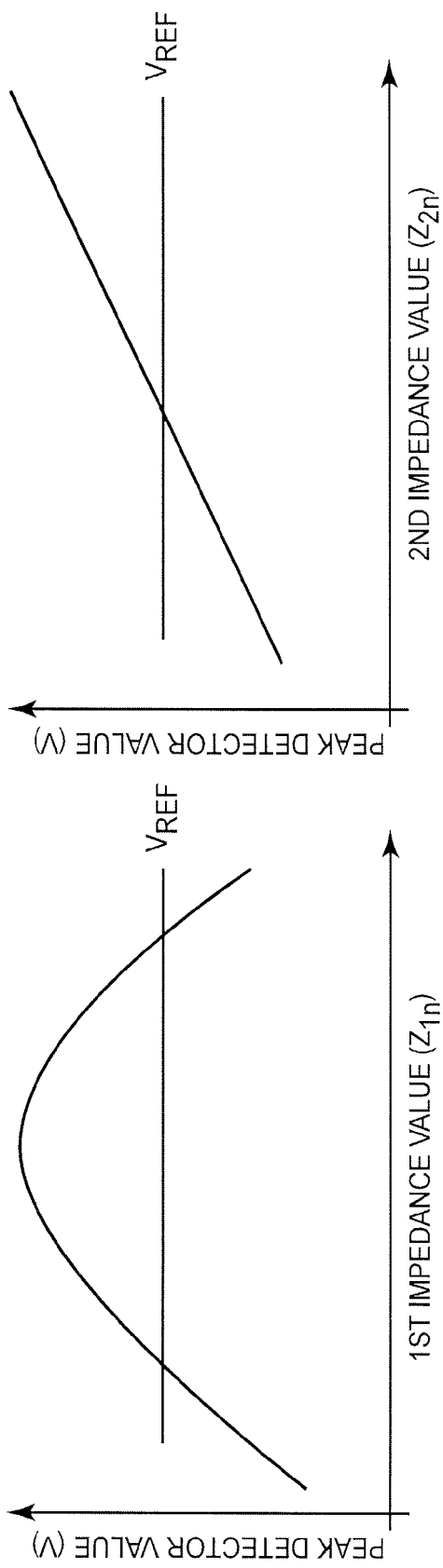

CALIBRATE OUTPUT MATCHING FOR CORRECT OUTPUT POWER

This application claims priority to Provisional U.S. Patent Applications 61/386,055 and 61/386,133 filed 24 Sep. 2010, both of which are incorporated herein by reference.

The invention described herein relates generally to controlling a load impedance of a power amplifier, and more particularly to separately controlling real and imaginary parts of the load impedance of the power amplifier.

BACKGROUND

The operation of a power amplifier, such as used to amplify wireless RF signals for transmission, largely depends on the load impedance of the amplifier. For example, a small load impedance may result in a large output power at the expense of a large output current, which translates into a low efficiency. Contrastingly, a large load impedance may result in less output power and current consumption, and thus have a higher efficiency. Because the amplifier load impedance directly affects the output power, it plays a critical role in a transmitter's ability to meet the strict output power requirements stipulated by many governing bodies. For example, regulations governed by the FCC (Federal Communications Commission) and/or ETSI (European Telecommunications Standards Institute) generally limit the maximum output power, while performance requirements (e.g., link loss, throughput, and the like) generally limit the minimum output power. To keep the transmitter output power within the desired range, the output power of the power amplifier in the transmitter is calibrated. Typical target accuracies are +/−1 dB.

Conventional calibration techniques, e.g., factory and "on chip" calibration techniques generally assume the transmitter load is at some predetermined and fixed impedance, e.g., 50Ω, even after application of one or more external elements. However, not all customer devices operate with that load. A mismatch between the actual transmitter load impedance and the predetermined load impedance degrades the accuracy of the calibration process. Thus, there remains a need for improved transmitter output power calibration techniques.

SUMMARY

Embodiments of a calibration unit disclosed herein calibrate a load impedance of a power amplifier to achieve a nominal amplifier load impedance after the connection of one or more external elements, e.g., antenna, to improve the accuracy and effectiveness of output power calibration. The calibration unit comprises an adaptive impedance unit and a controller. In one exemplary method and apparatus the adaptive impedance unit includes first and second variable impedance elements connected between the amplifier and the external load, e.g., antenna. The controller independently calibrates the imaginary and real parts of the load impedance by respectively selecting first and second calibration values for the first and second variable impedance elements. More particularly, the controller selects the first calibration value for the first variable impedance element from a first plurality of impedance values. The first calibration value produces a first calibrated voltage at the output of the power amplifier greater than the voltages produced at the output of the power amplifier by the remaining first plurality of impedance values. The controller selects the second calibration value for the second variable impedance element from a second plurality of impedance values, where the second calibration value produces a second calibrated voltage at the output of the power amplifier that meets or exceeds a reference voltage.

In another exemplary method and apparatus, the adaptive impedance unit comprises a balun and first and second variable impedance elements. A first winding of the balun connects between the differential outputs of a differential power amplifier. The first variable impedance element connects in parallel with the first winding of the balun, and is configured to control the imaginary part of the load impedance. The second variable impedance element connects in parallel with a second winding of the balun, and is configured to control the real part of the load impedance. In this embodiment, the controller calibrates the imaginary and real parts of the load impedance by applying a plurality of first and second impedance values to the respective first and second impedance elements and measuring an output voltage at the output of the power amplifier for one or more pairs of the first and second impedance values. The controller selects first and second calibration values for the first and second variable impedance elements from the plurality of first and second impedance values based on a comparison between the measured output voltages and a reference voltage.

BRIEF DESCRIPTION OF THE DRAWINGS

FIG. 3 depicts a plot of output voltages corresponding to a first plurality of impedance values applied to the first variable impedance element.

FIG. 4 depicts a plot of output voltages corresponding to a second plurality of impedance values applied to the second variable impedance element.

DETAILED DESCRIPTION

Figure 1:
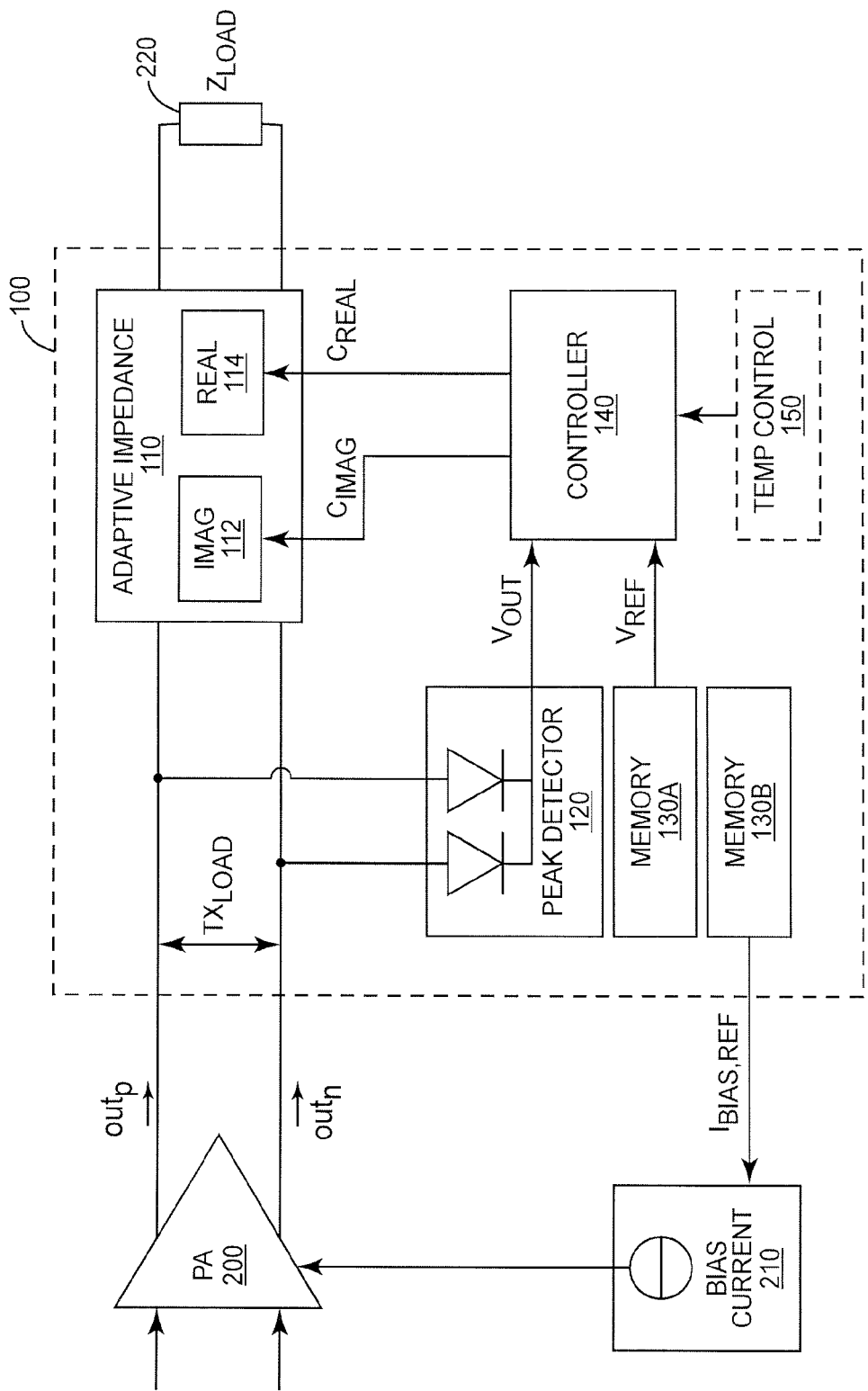
FIG. 1 depicts a block diagram of one exemplary calibration unit.

The calibration solution disclosed herein uses an adaptive load matching unit to adjust the amplifier load impedance to a nominal value, and therefore, to improve the effectiveness of an applied calibration technique. The adaptive load matching unit changes the load impedance of a transmitter, which may include the effects of an externally applied load, to a nominal load, e.g., 50Ω. As a result, the calibration technique disclosed herein maintains an output voltage, output power, and amplifier current at a desired level and within desired tolerances regardless of any external load mismatches caused by external elements (e.g., in a customer's device, coupled to the output of the transmitter).

Before describing the present invention in detail, the impact of different power amplifier loads on conventional calibration solutions is discussed. As noted above, conventional calibration solutions require the transmitter, and therefore the power amplifier, to have a fixed, predetermined load impedance, e.g., 50Ω. Tables 1-4 numerically depict how deviations from the predetermined load impedance impact the accuracy of conventional calibration techniques. Each of these tables list output power, output voltage, and/or bias current values for the same exemplary power amplifier. It will be appreciated that other power amplifiers would have similar results.

Most power amplifiers operate as a current source, where the voltage swing limits the maximum output power. The voltage swing is set by the current and the load. Table 1 depicts results for a conventional factory calibration technique, which relies on a standard environment and a fixed load to determine a calibration gain or bias value for the amplifier. Assuming the power amplifier is a 100 mA current source, different loads change the output power as depicted in Table 1.

TABLE 1

| Load Impedance (Ω) | Output Power (W) | Output Power (dBm) |
|---|---|---|
| 30 | 0.3 | 24.8 |
| 50 | 0.5 | 27.0 |
| 80 | 0.8 | 29.0 |
| 100 | 1.0 | 30.0 |

As depicted in Table 1, a target accuracy of +/−1 dB in the output power cannot be achieved in view of variations in the load impedance. Thus, the conventional factory calibration technique cannot be used to achieve the desired +/−1 dB accuracy unless the load impedance of the external elements coupled to the transmitter is generally 50Ω.

Because the current is constant, different loads result in different voltages. For the 100 mA current source and the same loads of Table 1, for example, a 30Ω load impedance results in a 3 V output voltage, a 50Ω load impedance results in a 5 V output voltage (which is the target value for the voltage detector), an 80Ω load impedance results in an 8 V output voltage, and a 100Ω load impedance results in a 10 V output voltage. Those skilled in the art will appreciate that because most amplifiers are limited first by the voltage, power amplifiers designed for a 5 V target voltage will have serious operational problems when the output voltage exceeds 5 V, e.g., reaches 8 V or 10 V, especially if linearity is important.

Another conventional calibration technique is provided by on-chip voltage peak detection. In this case, an output voltage is detected and an output power is measured. The detected voltage is correlated with the measured output power level. When the correlation shows a deviation between the detected voltage and a reference voltage (or a measured power level and a reference power level), the calibration process changes the current until the detected voltage matches the desired voltage. As depicted in Table 2, however, achieving the desired voltage does not provide the desired output or accuracy unless the load impedance is at a predetermined impedance level, e.g., 50Ω.

TABLE 2

| Load Impedance (Ω) | Detected Voltage (V) | Modified Current (mA) | Output Power (dBm) |
|---|---|---|---|
| 30 | 5 | 166 | 29.2 |
| 50 | 5 | 100 | 27.0 |
| 80 | 5 | 62.5 | 25.0 |
| 100 | 5 | 50 | 24.0 |

Note that the results of Table 2 are swapped from the results of Table 1, e.g., the 30Ω load impedance delivers too much power by 2 dBm in Table 2, where in Table 1 the 30Ω load impedance delivers too little power by 2 dB.

With such a voltage peak detector technique, another option would be to only correct for the square-root of the difference. Table 3 depicts the results.

TABLE 3

| Load Impedance (Ω) | Detected Voltage (V) | Modified Current (mA) | Output Power (dBm) |
|---|---|---|---|
| 30 | 3.8 | 129.1 | 27.0 |
| 50 | 5.0 | 100 | 27.0 |
| 80 | 6.3 | 80.1 | 27.0 |
| 100 | 7.1 | 70.7 | 27.0 |

While this approach provides the desired output power and accuracy, there are two drawbacks. First, as depicted in Table 3, the power amplifier would need to deliver 100 mA for the nominal case, but would need to deliver up to 30% more current for lower load impedances. It is unclear whether conventional power amplifiers can do so without encountering linearity problems or other problems associated with the current consumption being 30% over the specified current requirements. Table 3 also depicts that the power amplifier would need to be capable of delivering 6.3 V or 7.1 V for higher load impedances, where only 5 V is needed for the nominal case. This means that the headroom for the power amplifier should be designed for 7 V instead of 5 V. If the power amplifier does not provide this headroom, serious clipping and thus non-linearity issues will appear, which might result in ACPR (adjacent channel power rejection) violations from the FCC/ETSI. While using a power amplifier that does provide this headroom solves the linearity problem, such a power amplifier will not use the maximum available voltage swing under 50Ω conditions, and therefore will not have the minimum power consumption. Thus, while the squared error correction looks like a good solution for the output power problem, this solution compromises strongly on power consumption and linearity. For example, a 30Ω load requires 30% more drive current, and an 80Ω load requires 30% more voltage headroom. In general, power amplifiers with 30% more current and voltage headroom are undesirable because the performance on current consumption is unacceptable for the nominal case, which results in a sacrifice of a factor of two in power efficiency.

Another option uses the voltage detector and simply accepts the lower output power for the 80Ω and 100Ω scenarios. Table 4 depicts the results.

TABLE 4

| Load Impedance (Ω) | Detected Voltage (V) | Modified Current (mA) | Output Power (dBm) |
|---|---|---|---|
| 30 | 3.8 | 100 | 24.8 |
| 50 | 5.0 | 100 | 27.0 |
| 80 | 5.0 | 62.5 | 25.0 |
| 100 | 5.0 | 50 | 24.0 |

For the 30Ω load impedance scenario, the current of the power amplifier is limited so that linearity will not be an issue. By doing so the output power will also be below the desired 27.0 dBm target output power and the detected voltage will be too low, but the current of the amplifier will be at the maximum. Thus, FCC/ETSI requirements are not compromised and there is not a linearity problem. The only problem remaining is that the desired output power is not achieved, which may undesirably impact the link performance. Thus, the optimum performance is achieved only for a 50Ω load. There are no linearity or clipping issues for other loads. Reduction on output power for other loads is the result.

The calibration unit disclosed herein combines an on-chip adaptive load matching unit with on-chip calibration to provide a programmable calibration solution able to generate a constant output power with a maximum voltage swing and a minimum current (thus maximum efficiency). More particularly, the power amplifier is biased using a reference bias current determined for a nominal load, e.g., 50Ω. Because the bias current is determined for a predetermined load, a calibration unit attributes any differences between a reference voltage, also determined for the nominal load, and a measured amplifier output voltage to impedance mismatch caused by one or more external elements coupled to the transmitter, e.g., an antenna or other elements associated with a customer's device. Thus, by controlling the impedance of the adaptive matching unit based on the detected output voltage, the calibration unit disclosed herein compensates for the impedance mismatch without changing the amplifier current. Further, the calibration unit disclosed herein controls the amplifier load impedance while still maintaining the linear operation of the amplifier, maintaining the output voltage at a fixed level, maintaining the desired output power level within the desired tolerances, and using the maximum allowed swing without introducing linearity or clipping problems.

FIG. 1 depicts a block diagram of an exemplary calibration unit 100 coupled to a power amplifier 200 and bias unit 210 of a transmitter. The calibration unit 100 comprises an adaptive load matching unit 110, peak voltage detector 120, memories 130A, 130B, and controller 140. The power amplifier 200 amplifies an input transmission signal. It will be appreciated that the power amplifier 200 may comprise the illustrated differential amplifier, a single-ended power amplifier, or any type of power amplifier used in wireless RF transmitters.

The adaptive load matching unit 110 is coupled between an external load 220 and the power amplifier output(s), e.g., between the differential outputs of a differential power amplifier 200. Adaptive load matching unit 110 comprises first and second variable impedance elements 112, 114, that are selectively varied to control the imaginary and real parts of the amplifier load impedance. Exemplary variable impedance units 112, 114 include variable or otherwise programmable capacitors. Generally, the variable impedance elements 112, 114 are orthogonal such that they are less than 25% correlated. Thus, varying impedance element 112 varies the imaginary part of the amplifier load impedance and has little to no effect on the real part, while varying impedance element 114 varies the real part of the amplifier load impedance and has little to no effect on the imaginary part. By configuring the impedance elements in this manner, the adaptive load matching unit 110 provides tight and generally separate control over the real and imaginary parts of the amplifier load impedance, and therefore, enables the calibration unit 100 to correct for impedance mismatch caused by the externally applied load $Z_{load}$ 220. In so doing, the calibration unit 100 disclosed herein provides a constant transmitter output power with a maximum voltage swing and a minimum current (thus maximum efficiency).

The peak voltage detector 120, memories 130A, 130B, and controller 140 calibrate the output power of the power amplifier 200 by adjusting the amplifier load impedance. While peak detector 120 is depicted as being separate from the controller 140, it will be appreciated that peak detector 120 may be implemented as part of controller 140. Memories 130A, 130B comprise on-chip memories that store values required for the calibration operations. For example, a first memory 130A stores a reference voltage corresponding to the desired output voltage for a nominal load, e.g., a 50Ω load. The reference voltage is determined during testing at the manufacturing site (based on a nominal load), and is written to memory 130A during fabrication. A second memory 130B stores a reference bias current for adjusting the bias current for the correct power level. The reference bias current is also determined during testing at the manufacturing site, using the nominal settings for the adaptive load matching unit 110, and is written to memory 130B during fabrication. Bias unit 210 adjusts the bias of the power amplifier 200 based on the stored reference bias current. While the memories 130A, 130B are depicted as separate memory elements, it will be appreciated that the reference voltage and reference bias current may be stored in any type of memory.

Because the reference bias current $I_{bias,ref}$ and reference voltage $V_{ref}$ stored in memories 130A, 130B are predetermined based on a nominal load impedance, e.g., 50Ω, accurate calibration may be achieved by controlling the amplifier load impedance to achieve the nominal amplifier load impedance after any external load 220 is applied to the transmitter. More particularly, after biasing the power amplifier 200 using $I_{bias,ref}$ stored in memory 130B, peak voltage detector 120 detects the output voltage $V_{out}$ of the power amplifier 200 and provides $V_{out}$ to controller 140. Controller 140 compares $V_{out}$ to the reference voltage $V_{ref}$ stored in memory 130A, and adjusts the imaginary and real impedance elements 112, 114 of the adaptive matching unit 110 based on the comparison. In so doing, the calibration unit 100 disclosed herein calibrates the output power of the amplifier 200 by separately adjusting the real and imaginary parts of the amplifier load impedance to match the real and imaginary parts of the nominal impedance used to derive the bias current and reference voltage.

Figure 2:
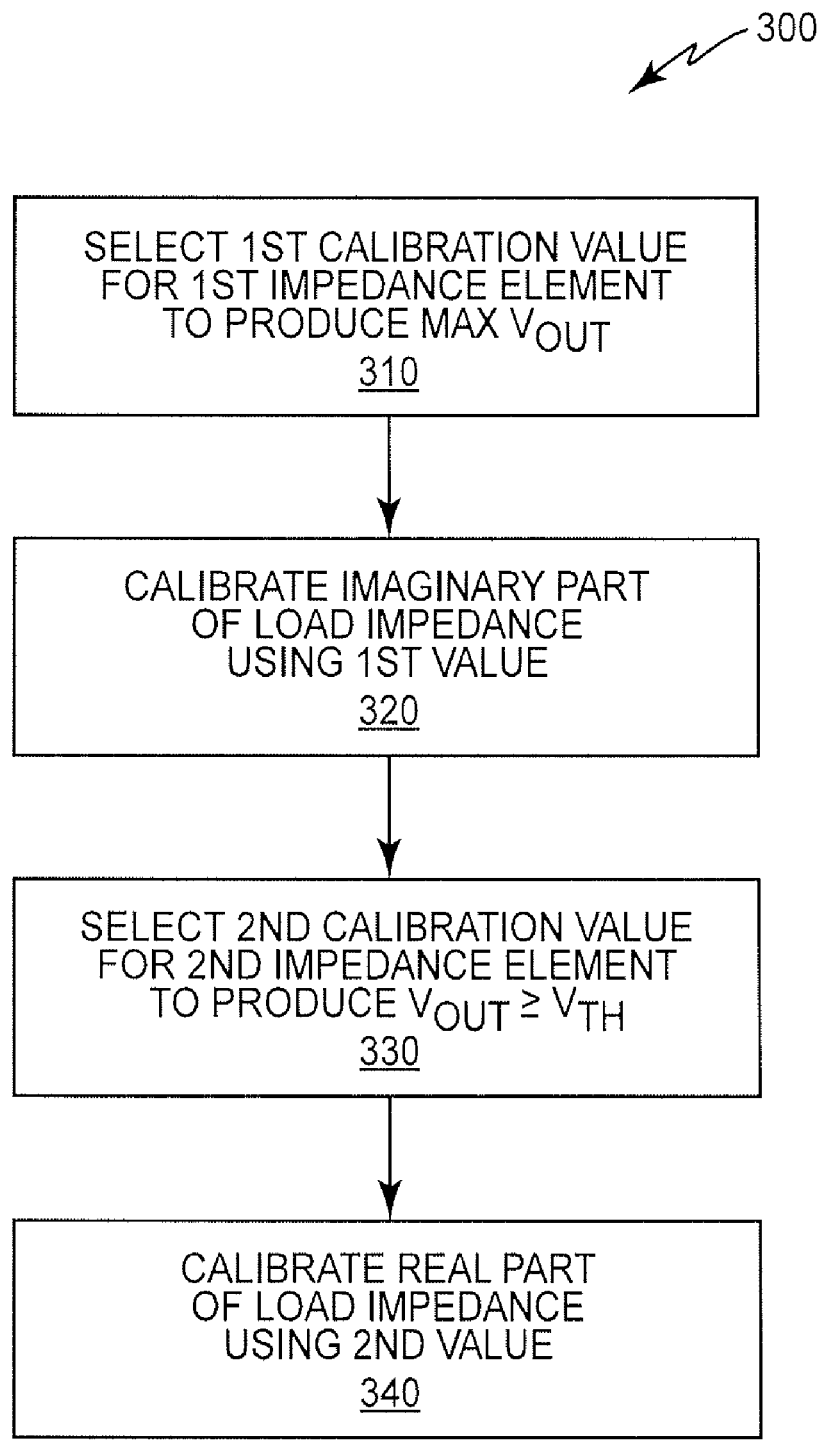
FIG. 2 depicts a flow chart of one exemplary calibration process.

FIG. 2 depicts an exemplary method 300 executed by controller 140. In the exemplary method 300, controller 140 selects a first calibration value for the first impedance element to produce a maximum output voltage $V_{out}$ (block 310), and calibrates the imaginary part of the load impedance using the selected first calibration value for the first impedance element (block 320). The controller 140 also selects a second calibration value for the second impedance element to produce an output voltage $V_{out}$ that meets or exceeds $V_{ref}$ (block 330), and calibrates the real part of the load impedance using the selected second calibration value for the second impedance element (block 340). The controller 140 may calibrate the real and imaginary parts of the load impedance using control signals $C_{imag}$, $C_{real}$ (FIG. 1) that control the impedance of the first and second impedance elements 112, 114, respectively, based on a nominal amplifier load impedance, amplifier efficiency, amplifier output power, and the like. In one embodiment, control signals $C_{imag}$ and $C_{real}$ comprise digital control signals. Analog control signals, however, may be used in other embodiments.

In one exemplary embodiment, controller 140 calibrates the imaginary part of the load impedance by separately applying a plurality of impedances to the first impedance element 112. Peak detector 120 measures $V_{out}$ responsive to each of the applied impedances, and supplies the measured voltages to the controller 140. As depicted in FIG. 3, the measured output voltages form a Gaussian type curve that has a relative peak, where the relative peak voltage exceeds the $V_{ref}$. Controller 140 compares the measured voltages to identify the relative peak voltage, and selects the impedance value corresponding to the identified relative peak voltage as the first calibration value for the first impedance element 112. In some embodiments, controller 140 may apply each of the plurality of impedances to the first impedance element 112 to generate the complete curve, as depicted in FIG. 3. In other embodiments, controller 140 may sequentially apply the impedances to the first impedance element 112 until a relative peak voltage is identified.

Controller 140 may also offset the selected first calibration value to achieve a desired amplifier efficiency. For example, if the impedance value applied just previous to or just after the selected first calibration value provides a higher amplifier efficiency, controller 140 may offset the selected calibration impedance value to one of the higher efficiency impedance values to improve the efficiency while incurring little to no impact on the amplifier gain and/or output power.

After setting the first impedance element 112 to the first calibration value, controller 140 calibrates the real part of the load impedance by separately applying a plurality of impedances to the second impedance element 114. Peak detector 120 measures $V_{out}$ responsive to each of the applied impedances, and supplies the measured voltages to the controller 140. As depicted in FIG. 4, as the impedance applied to the second impedance element 114 increases, the measured output voltage also increases. Controller 140 compares the measured voltages to $V_{ref}$, and selects the impedance value corresponding to any of the measured output voltages that meet or exceed $V_{ref}$ as the second calibration value for the second impedance element 114. In a preferred embodiment, the selected $2^{nd}$ calibration value corresponds to the measured output voltage closest to $V_{ref}$ that is also greater than or equal to $V_{ref}$. In some embodiments, the controller 140 may apply each of the plurality of impedances to the second impedance element 114 to generate the complete curve, as depicted in FIG. 4. In other embodiments, controller 140 may sequentially apply the plurality of impedances to the second impedance element 114 just until the measured output voltage exceeds $V_{ref}$.

Figure 5:
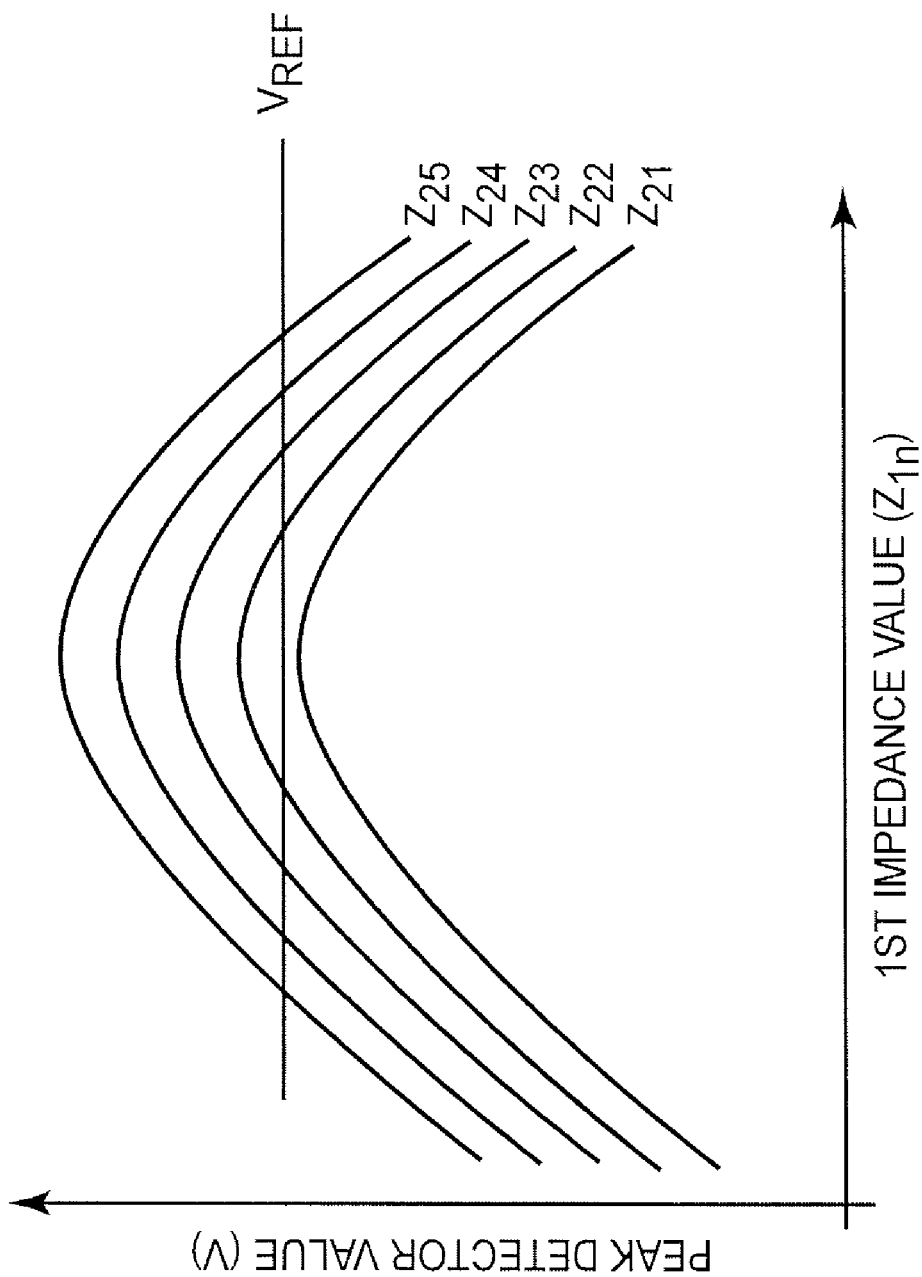
FIG. 5 depicts a plot of output voltages corresponding to different pairs of impedance values applied to the first and second impedance elements.

In another embodiment, controller 140 may vary the first and second impedance elements 112, 114 at the same time. In this case, the controller 140 cycles through pairs of impedance values for the first and second impedance elements 112, 114. The resulting voltages measured by peak detector 120 form the curves depicted in FIG. 5. Controller 140 selects the first and second calibration values for the first and second impedance elements 112, 114 from the plurality of impedance values applied to the first and second impedance elements 112, 114 based on a comparison between these curves and the reference voltage. More particularly, controller 140 selects the pair of impedances that collectively form a relative maximum greater than or equal to the reference voltage as the first and second calibration voltages. In the example depicted in FIG. 5, the selected calibration impedance values correspond to the first impedance value associated with the relative maximum voltage on the curve associated with $Z_{22}$.

Figure 6:
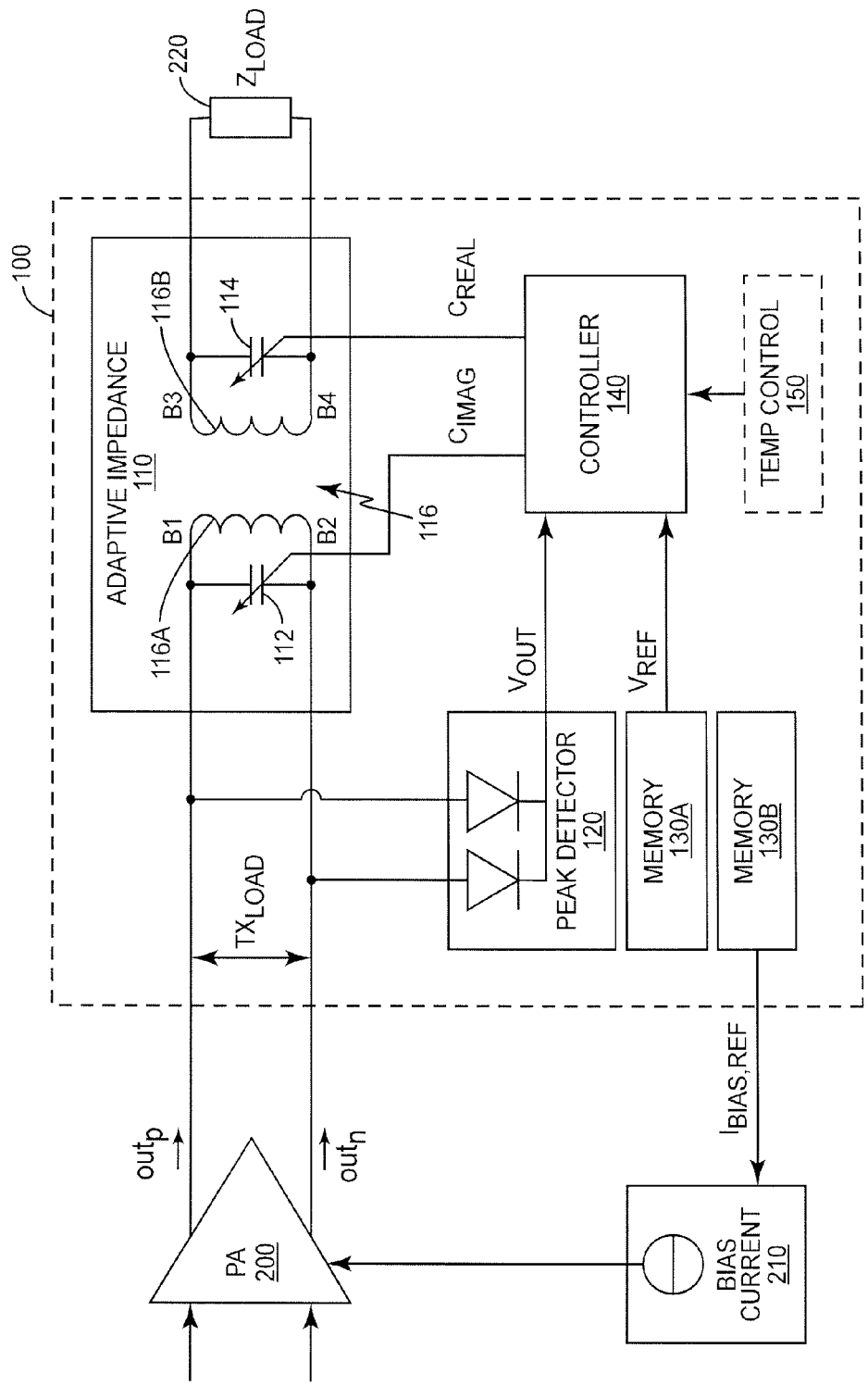
FIG. 6 depicts a block diagram of another exemplary calibration unit.
Figure 7:
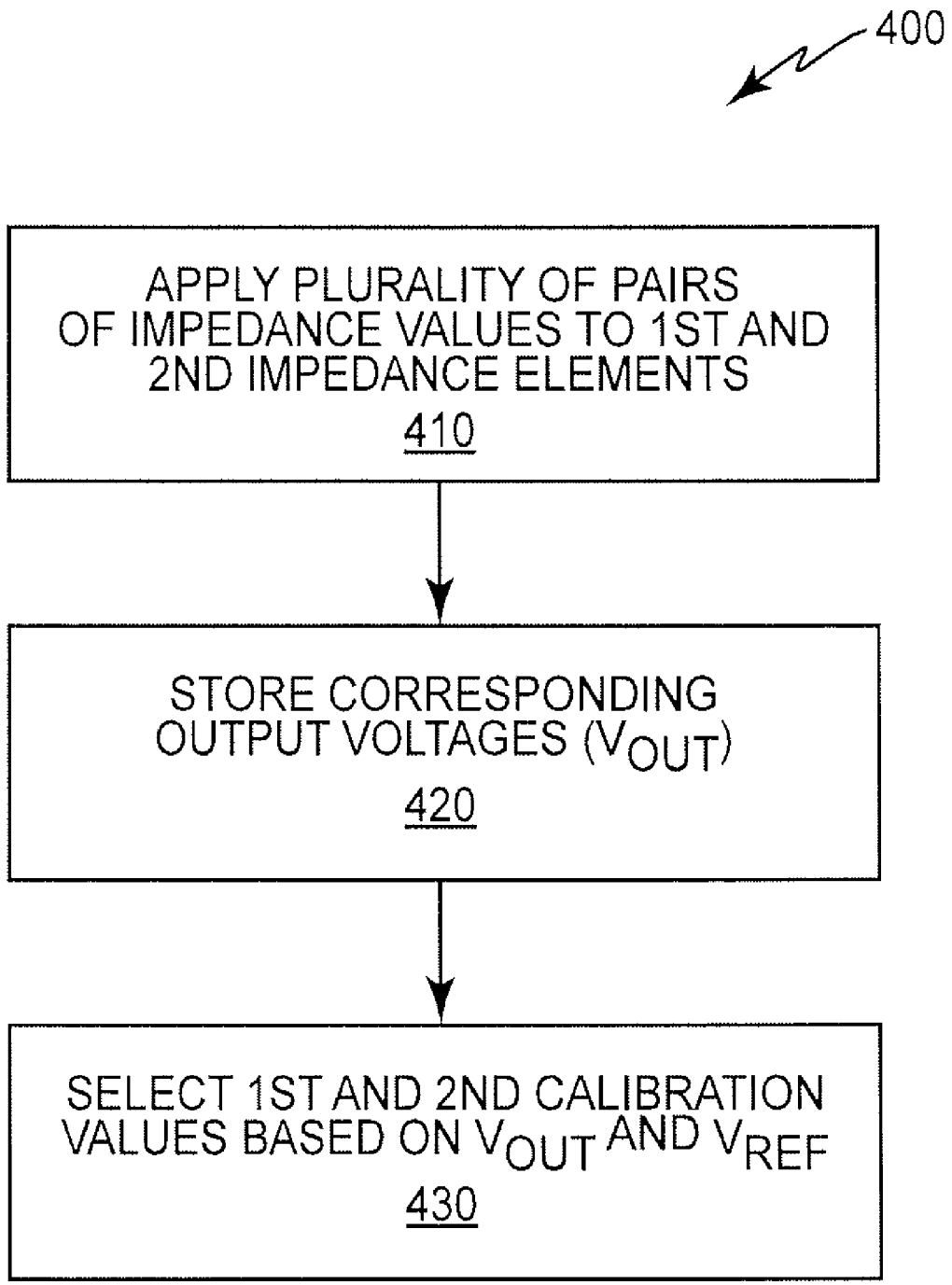
FIG. 7 depicts another flow chart of one exemplary calibration process.

The above describes a general calibration technique applicable to any calibration unit that enables separately adjusting the imaginary and real parts of the amplifier load impedance to correct load mismatch. FIG. 6 depicts an exemplary calibration unit 100 with a specific implementation of an adaptive load matching unit 110. In this embodiment, the adaptive load matching unit 110 comprises balun 116 having a first inductive winding 116A and a second inductive winding 116B. The first inductive winding 116A includes two connection points B1, B2 on either end of the first winding 116A that respectively connect to the differential outputs $out_p$, $out_n$ to connect the first inductive winding 116A between the differential amplifier outputs. The second inductive winding 116B includes two connection points B3, B4 on either end of the second winding 116B that connect to an external load 220. The first and second inductive windings 116A, 116B electromagnetically couple based on the number and relative orientation of turns in the first and second windings 116A, 116B. The first variable impedance element 112 comprises a first variable capacitor 112, also referred to herein as transmitter capacitor 112, connected in parallel with the first winding 116A. The second variable impedance element 114 comprises a second variable capacitor 140, also referred to herein as antenna capacitor 140, connected in parallel with the second winding 116B. The variable capacitors 112, 114 may comprise any type of variable and/or programmable capacitor. Exemplary variable capacitors 112, 114 include those disclosed in U.S. Provisional Application Ser. No. 61/386,055 and U.S. Utility application Ser. No. 12/982,276, both of which are incorporated herein by reference. Controller 140 controls the first and second impedance elements 112, 114 as discussed above. For example, controller 140 may execute the process 400 depicted in FIG. 7, where the controller applies a plurality of first and second capacitance values to the first and second variable capacitors 112, 114 (block 410), and stores the resulting output voltage measured by the peak detector 120 for each pair of first and second capacitance values (block 420). The controller 140 then calibrates the imaginary and real parts of the load impedance by selecting first and second calibration values from the plurality of impedance values based on a comparison between the stored output voltages and the reference voltage $V_{ref}$ (block 430).

As depicted in FIGS. 1 and 6, calibration unit 100 may include a temperature controller 150 configured to compensate for temperature variations that may negatively impact the calibration process. For example, temperature controller 150 may measure a temperature of the power amplifier, and determine first and second offsets for the calibration first and second values based on the measured temperature. Controller 140 then applies the first and second offsets to the calibration first and second values to compensate for the temperature.

Figure 8:
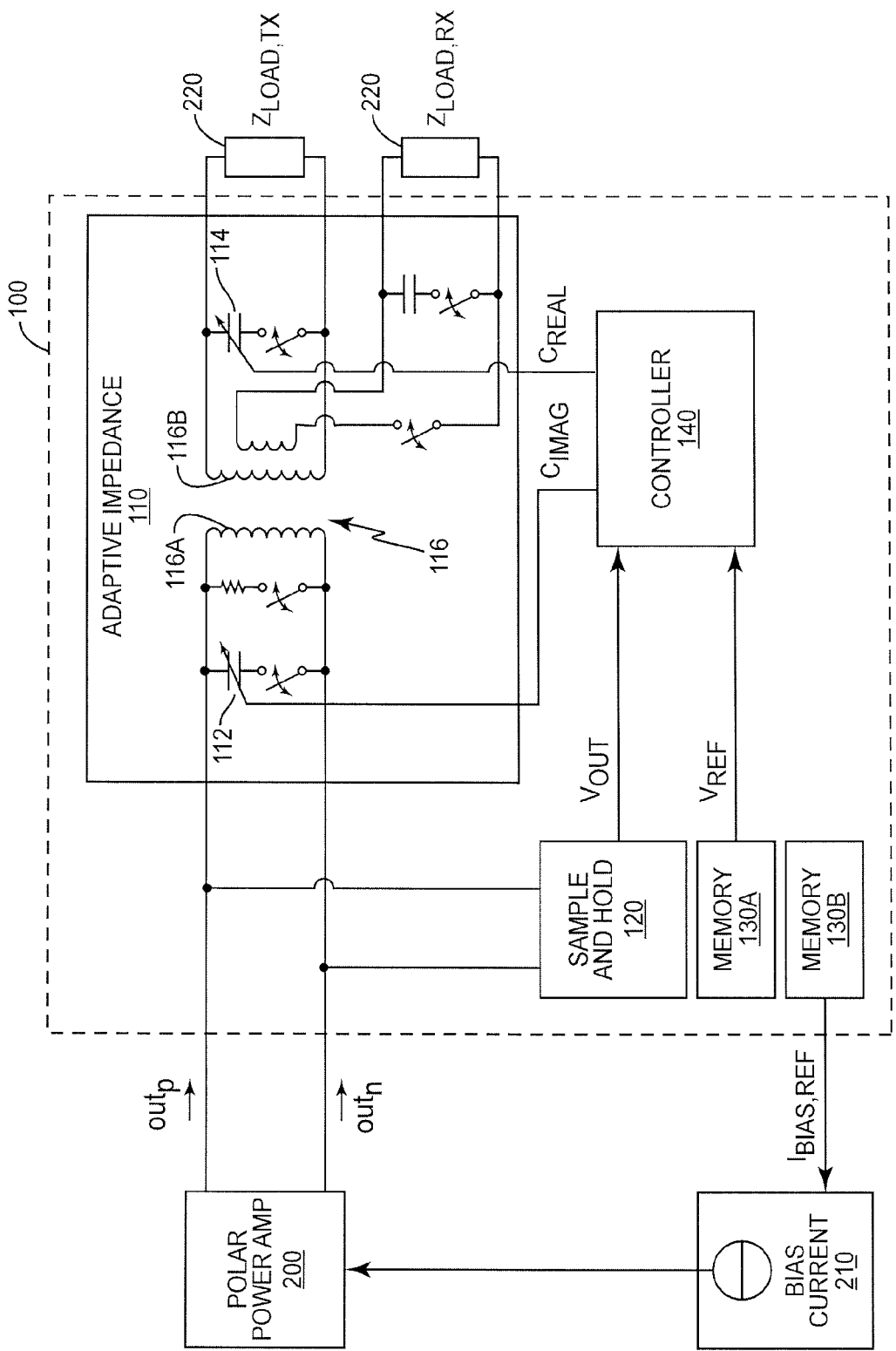
FIG. 8 depicts a circuit diagram for an exemplary calibration unit.

FIG. 8 depicts circuit details for one exemplary calibration unit 100 coupled to the power amplifier 200 and bias unit 210. In this embodiment, power amplifier 200 comprises a polar power amplifier with an RF-current mirror, which enables precise control of the amplifier current based on the reference bias current stored in the memory 130B. The adaptive load matching unit 110 in this embodiment comprises a triple winding balun 112 with integrated antenna switch and ESD protection. The peak voltage detector 120 is implemented as a sample/hold type of detector, where a digital reference can be programmed, and only a 0 (measured value is lower than the voltage reference) or a 1 (measured value is higher than the voltage reference) is returned. Such a sample/hold detector enables the peak voltage detector 120 to be controlled by only digital lines (both at the input and output), which simplifies integration of the peak voltage detector onto the amplifier chip. All elements are integrated on chip, using 45 nm sub-micron standard CMOS process, and no dedicated process steps are added.

In another embodiment, the transmitter comprises a classical direct-up converter (instead of polar transmitter), for WLAN, or UMTS, where the power amplifier 200 comprises a classical class AB amplifier (instead of a digital amplifier), and the peak voltage detector 120 comprises a standard peak detector (voltage) with an analog output or a digitized output. The adaptive load matching unit 110 may be similar to the triple winding solution depicted in FIG. 7, but without the $3^{rd}$ winding for RX and the antenna switch. The antenna switch may be external.

The calibration unit 100 of the present invention has several advantages over conventional solutions. For example, calibration unit 100 accurately achieves the desired output power level while maintaining optimum current consumption (efficiency) and linearity, and without adding complex, bulky external components with only a minor increase in chip area. Without the adaptive calibration of the amplifier load impedance, the external load must be perfectly matched to the amplifier load to get the maximum performance out the transmitter. The calibration unit 100 described herein does not require such perfect matching, and therefore, provides improvements over the prior art.

While the on-chip adaptive load matching unit 110 disclosed herein has tuning range limitations, the calibration unit of the present invention facilitates correcting even this problem. For example, the adaptive load matching unit 110 can generally tune 50% of the real impedance, e.g., between 70Ω and 110Ω. These values are at the TX-terminals before the adaptive match, but the ratio still holds for the load impedance after the adaptive match. Because of this limitation, the adaptive load matching unit 110 may not be able to tune a severely mismatched external device. However, an application engineer may easily read the adaptive matching tuning values (without modifying or adding components to the transmitter or calibration unit), and can directly determine that the external load 220 applied is too high or too low. For example, the load impedance applied at the TX-side (TX-load) can be measured using a calibrated network analyzer. Alternatively, the customer may save information provided to the controller 140 to a file and send it to an application engineer. Based on the provided information, the application engineer is able to tell the customer the load impedance 220 of their device and if it should be lower or higher. Thus, the calibration unit 100 provides the additional advantage of easier customer support in cases of severely mismatched load impedances, which saves money.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A calibration unit that separately calibrates real and imaginary parts of a load impedance of a power amplifier, the impedance matching network comprising:
    an adaptive impedance unit operatively connected to an output of the power amplifier, said adaptive impedance unit comprising first and second variable impedance elements configured to independently control the imaginary and real parts of the load impedance, respectively; and
    a controller operatively connected to the adaptive impedance unit and configured to respectively calibrate the imaginary and real parts of the load impedance by:
        selecting a first calibration value for the first variable impedance element from a first plurality of impedance values, said first calibration value producing a first calibrated voltage at the output of the power amplifier greater than voltages produced at the output of the power amplifier by the remaining first plurality of impedance values; and
        selecting a second calibration value for the second variable impedance element from a second plurality of impedance values, said second calibration value producing a second calibrated voltage at the output of the power amplifier that meets or exceeds a reference voltage.

2. The calibration unit of claim 1 wherein the controller further calibrates the imaginary part of the load impedance by offsetting the selected first calibration value based on a desired amplifier efficiency.

3. The calibration unit of claim 1 wherein the controller calibrates the imaginary part of the load impedance by:
    measuring a plurality of first voltages at the output of the power amplifier, each of said first voltages produced by one of the first plurality of values;
    comparing the plurality of first voltages to identify a relative maximum voltage as the first calibrated voltage;
    selecting the impedance value from the first plurality of impedance values corresponding to the first calibrated voltage as the first calibration value; and
    calibrating the imaginary part of the load impedance by setting the first variable impedance element to the selected first calibration value.

4. The calibration unit of claim 3 wherein the controller calibrates the real part of the load impedance by:
    measuring a plurality of second voltages at the output of the power amplifier, each of said second voltages produced by one of the second plurality of values;
    comparing the plurality of second voltages to the reference voltage;
    selecting the impedance value from the second plurality of impedance values corresponding to one of the plurality of second voltages that meets or exceeds the reference voltage as the second calibration value; and
    calibrating the real part of the load impedance by setting the second variable impedance element to the selected second calibration value.

5. The calibration unit of claim 4 further comprising a peak detector operatively connected to the output of the power amplifier to measure the plurality of first and second voltages.

6. The calibration unit of claim 1 wherein the adaptive impedance unit comprises a balun having a first winding operatively connected between differential outputs of the power amplifier, wherein the first variable impedance element operatively connects to the differential outputs in parallel with the first winding of the balun, and wherein the second variable impedance element operatively connects in parallel with a second winding of the balun.

7. The calibration unit of claim 6 wherein the first variable impedance element comprises a first variable capacitor operatively connected to the differential outputs in parallel with the first winding of the balun, and wherein the second variable impedance element comprises a second variable capacitor operatively connected in parallel with the second winding of the balun.

8. The calibration unit of claim 1 wherein the first and second variable impedance elements are generally orthogonal such that the first and second variable impedance elements are less than 25% correlated.

9. The calibration unit of claim 1 further comprising a current generator to apply a reference bias current to an amplifier supply to configure the power amplifier to generate a desired output power for a predetermined load impedance, wherein calibrating the real and imaginary parts of the load impedance comprises calibrating the real and imaginary parts of the load impedance to generally match respective real and imaginary parts of the predetermined load impedance.

10. The calibration unit of claim 1 further comprising a temperature control unit configured to:
    measure a temperature of the power amplifier;

determine a first offset for the first calibration value based on the temperature;

determine a second offset for the second calibration value based on the temperature; and apply the first and second offsets to the first and second calibration values, respectively.

11. A method of separately calibrating real and imaginary parts of a load impedance of a power amplifier by separately calibrating first and second variable impedance elements of an adaptive impedance unit operatively connected to an output of the power amplifier, the method comprising:

calibrating the imaginary part of the load impedance by selecting a first calibration value for the first variable impedance element from a first plurality of impedance values, said first calibration value producing a first calibrated voltage at the output of the power amplifier greater than voltages produced at the output of the power amplifier by the remaining first plurality of impedance values; and calibrating the real part of the load impedance by selecting a second calibration value for the second variable impedance element from a second plurality of impedance values, said second calibration value producing a second calibrated voltage at the output of the power amplifier that meets or exceeds a reference voltage.

12. The method of claim 11 further comprising offsetting the selected first calibration value based on desired amplifier efficiency.

13. The method of claim 11 wherein calibrating the imaginary part of the load impedance comprises:

measuring a plurality of first voltages at the output of the power amplifier, each of said first voltages produced by one of the first plurality of impedance values;

comparing the plurality of first voltages to identify a relative maximum voltage as the first calibrated voltage;

selecting the impedance value from the first plurality of values corresponding to the first calibrated voltage as the first calibration value; and calibrating the imaginary part of the load impedance by setting the first variable impedance element to the selected first calibration value.

14. The method of claim 13 wherein calibrating the real part of the load impedance comprises:

measuring a plurality of second voltages at the output of the power amplifier, each of said second voltages produced by one of the second plurality of impedance values;

comparing the plurality of second voltages to the reference voltage;

selecting the impedance value from the second plurality of impedance values corresponding to one of the plurality of second voltages that meets or exceeds the reference voltage as the second calibration value; and calibrating the real part of the load impedance by setting the second variable impedance element to the selected second calibration value.

15. The method of claim 11 wherein the adaptive impedance unit comprises a balun having a first winding operatively connected between differential outputs of the power amplifier, wherein the first variable impedance element operatively connects to the differential outputs in parallel with the first winding of the balun, and wherein the second variable impedance element operatively connects in parallel with a second winding of the balun.

16. The method of claim 15 wherein the first variable impedance element comprises a first variable capacitor operatively connected to the differential outputs in parallel with the first winding of the balun, and wherein the second variable impedance element comprises a second variable capacitor operatively connected in parallel with the second winding of the balun.

17. The method of claim 11 wherein the first and second variable impedance elements are generally orthogonal such that the first and second variable impedance elements are less than 25% correlated.

18. The method of claim 11 further comprising applying a reference bias current to an amplifier supply to configure the power amplifier to generate a desired output power for a predetermined load impedance, wherein calibrating the real and imaginary parts of the load impedance comprises calibrating the real and imaginary parts of the load impedance to generally match real and imaginary parts of the predetermined load impedance.

19. The method of claim 11 further comprising:

measuring a temperature of the power amplifier;

determining a first offset for the first calibration value based on the temperature;

determining a second offset for the second calibration value based on the temperature; and applying the first and second offsets to the first and second calibration values, respectively.

20. A calibration unit that separately calibrates real and imaginary parts of a load impedance of an on-chip differential power amplifier, the impedance matching network comprising:

an adaptive impedance unit comprising:

an on-chip balun having a first winding operatively connected between differential outputs of the differential power amplifier;

a first variable impedance element operatively connected to the differential outputs in parallel with the first winding of the balun and configured to control the imaginary part of the load impedance;

a second variable impedance element operatively connected in parallel with a second winding of the balun and configured to control the real part of the load impedance;

a controller operatively connected to the adaptive impedance unit and the peak detector, said controller comprising an impedance selector configured to apply a plurality of first and second impedance values to the first and second variable impedance elements, respectively; and a voltage detector configured to measure an output voltage at the output of the power amplifier for one or more pairs of the first and second impedance values;

wherein the controller is further configured to calibrate the imaginary and real parts of the load impedance by selecting first and second calibration values from the plurality of first and second impedance values, respectively, based on a comparison between the measured output voltages and a reference voltage, and wherein said controller is further configured to calibrate the imaginary part of the load impedance by offsetting the selected first value based on desired amplifier efficiency.

21. The calibration unit of claim 20 wherein the first and second variable impedance elements are generally orthogonal such that the first and second variable capacitors are less than 25% correlated.

22. A method of separately calibrating real and imaginary parts of a load impedance of an on-chip differential power amplifier, the method comprising:

connecting a first winding of an on-chip balun between differential outputs of the differential power amplifier;

connecting a first variable impedance element to the differential outputs in parallel with the first winding of the balun;
connecting a second variable impedance element in parallel with a second winding of the balun; and
calibrating the imaginary and real parts of the load impedance by:
   applying a plurality of first and second impedance values to the first and second variable impedance elements, respectively;
   measuring an output voltage at the output of the power amplifier for one or more pairs of the first and second impedance values;
   selecting first and second calibration values for the first and second impedance elements from the plurality of first and second impedance values, respectively, based on a comparison between the measured output voltages and a reference voltage; and
   offsetting the selected first calibration value based on a desired amplifier efficiency.

23. The method of claim 22 wherein the first and second variable impedance elements are generally orthogonal such that the first and second variable capacitors are less than 25% correlated.

* * * * *

UNITED STATES PATENT AND TRADEMARK OFFICE
CERTIFICATE OF CORRECTION

PATENT NO. : 8,294,514 B2  
APPLICATION NO. : 12/982420  
DATED : October 23, 2012  
INVENTOR(S) : Visser et al.

Page 1 of 1

It is certified that error appears in the above-identified patent and that said Letters Patent is hereby corrected as shown below:

In The Claims

In Column 11, Line 27, in Claim 12, delete "on desired" and insert -- on a desired --, therefor.

In Column 12, Line 43, in Claim 20, delete "unit and the peak detector, said" and insert -- unit, said --, therefor.

In Column 12, Line 47, in Claim 20, delete "detector configured" and insert -- detector operatively connected to the controller and configured --, therefor.

In Column 12, Line 58, in Claim 20, delete "on desired" and insert -- on a desired --, therefor.

Signed and Sealed this
Nineteenth Day of April, 2016

Michelle K. Lee
*Director of the United States Patent and Trademark Office*